United States Patent [19]

Hock et al.

[11] Patent Number: 4,904,213

[45] Date of Patent: Feb. 27, 1990

[54] LOW IMPEDANCE ELECTRIC CONNECTOR

[75] Inventors: See S. Hock; Chan S. Loon, both of Penang, Malaysia

[73] Assignee: Motorola, Inc., Schaumburg, Ill.

[21] Appl. No.: 334,024

[22] Filed: Apr. 6, 1989

[51] Int. Cl.[4] .............................................. H01R 4/24
[52] U.S. Cl. .................................... 439/824; 439/482
[58] Field of Search ................. 439/482, 816, 819, 824

[56] References Cited

U.S. PATENT DOCUMENTS

| | | | |
|---|---|---|---|
| 2,724,096 | 11/1955 | Klostermann | 439/824 |
| 3,435,168 | 3/1969 | Cooney | 439/482 |
| 4,597,622 | 7/1986 | Coe | 439/482 |

*Primary Examiner*—Joseph H. McGlynn

*Attorney, Agent, or Firm*—Donald B. Southard

[57] ABSTRACT

A low impedance, spring loaded electric connector which comprises a cylindrical body receiving a conductive wire, a plunger guided by the body and having a tip for electrically contacting with an external conductive surface, a spring compressed between the body and the plunger. The plunger can slide along the body, and is biased by the spring to assure reliable contact with the conductive surface. This connector, further, includes a resilient and conducting cantilever making sliding contact between the plunger and the body for establishing an electric path bypassing the spring. The cantilever may be formed as a portion of the plunger, or alternatively may be made as a separate one attached to the plunger or the body.

10 Claims, 4 Drawing Sheets

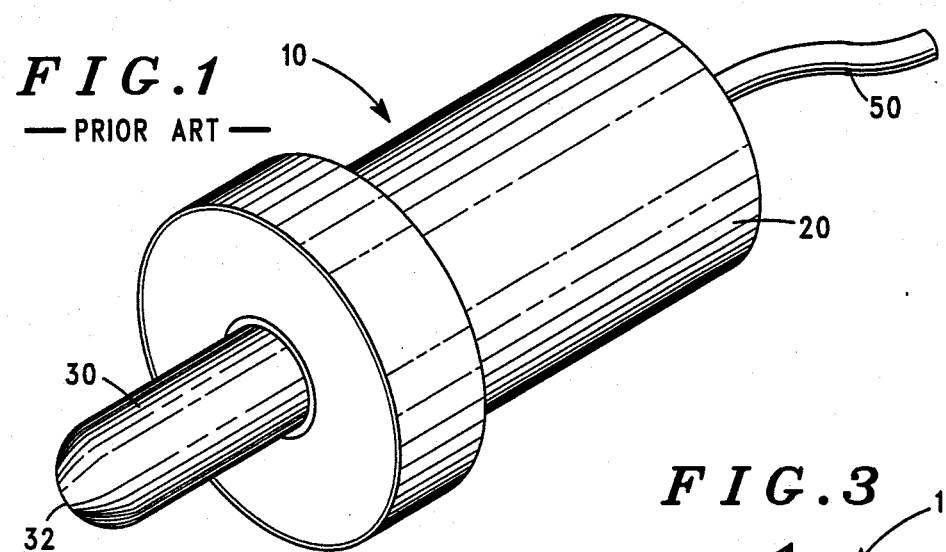
FIG.1 — PRIOR ART —
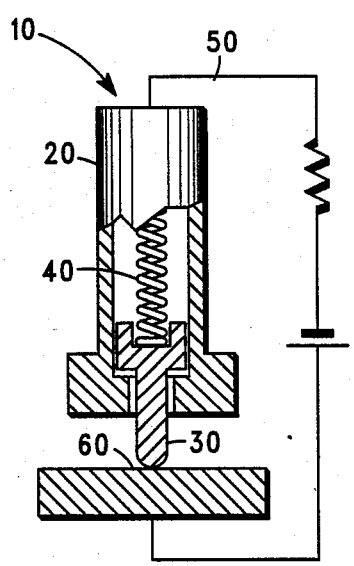
FIG.2 — PRIOR ART —
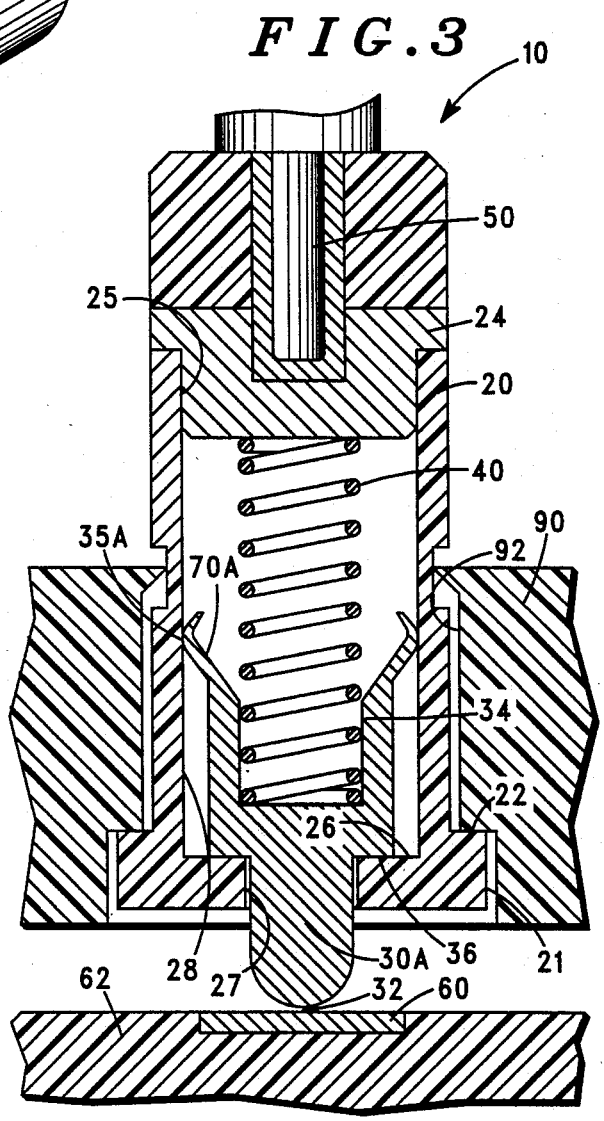
FIG.3

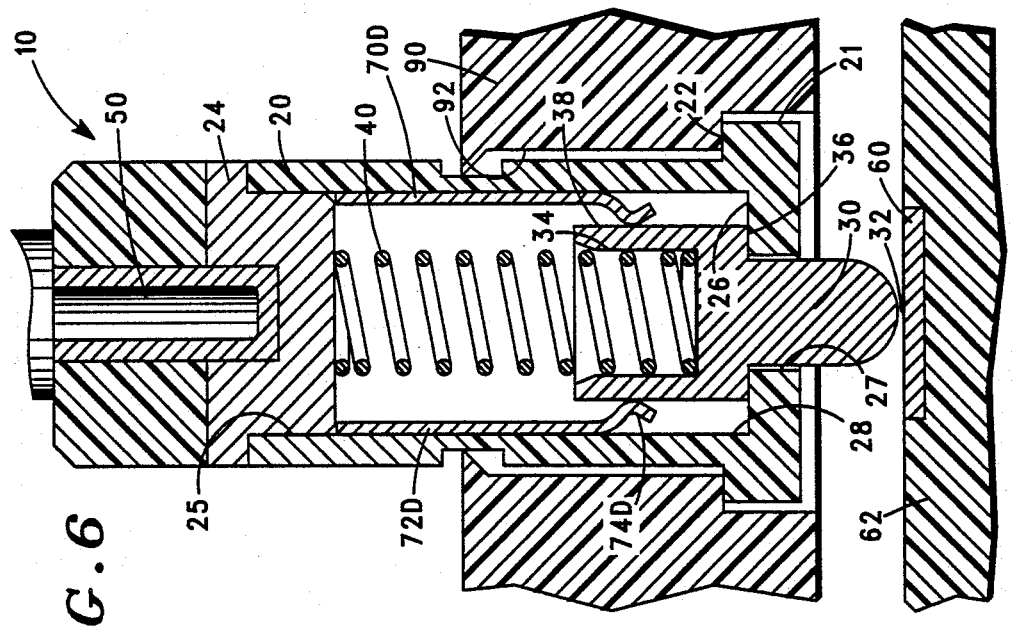
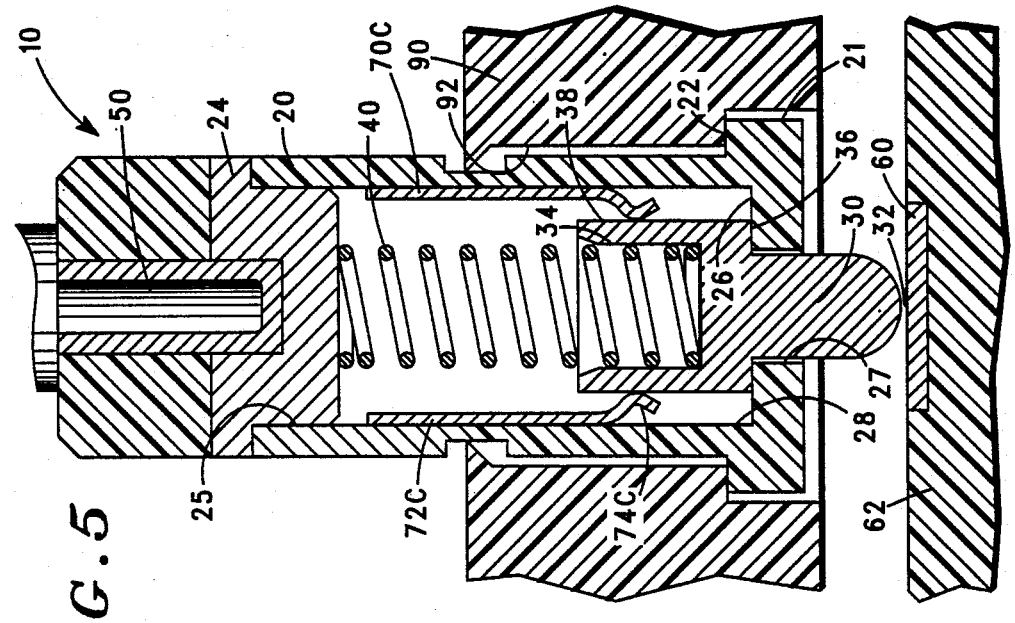

LOW IMPEDANCE ELECTRIC CONNECTOR

BACKGROUND OF THE INVENTION

1. Technical Field of the Invention

The present invention pertains generally to an electric connector. More specifically, the present invention pertains to a spring loaded electric connector having low and constant impedance, for connecting electrical signals.

2. Description of the Prior Art

In electrical communication devices such as radio transceivers or telephones, a universal connecting system is used for connecting between a main body and a speaker-microphone. The universal connecting system can be used also for connecting a radio transceiver to other remote devices. For example, some kind of portable radio transceiver may be changed to a car radio transceiver by connecting the portable radio to a communication device mounted in a car via such universal connecting system. Such universal connecting system, in general, comprises a male multi-connector and a female multi-connector. The male multi-connector includes a plurality of pin type connectors, and the female multi-connector includes a plurality of surface type connectors.

An example of such a conventional pin type connector is shown and generally indicated at 10, in FIG. 1. Plural pin type connectors like this are mounted together onto a mounting panel to constitute one male multi-connector. The conventional pin type connector 10 comprises, basically, a hollow cylindrical body 20, a plunger 30 contained in and projected from the body, a wire 50 attached to the body and a coil spring 40 positioned within the body (cf. FIG. 2). Pin type connector 10 is pressed against a corresponding surface type connector 60 to make electrical contact between a tip 32 of plunger 30 and surface 60. Plunger 30 can slide along body 20 and is biased by coil spring 40 toward an extended position in order to assure positive contact. An electrical current passes from surface 60 and plunger 30, through the coil spring 40, to wire 50.

However, a coil spring has high inductance because of its spiral figure and has resistance due to its wire length. These high inductance and resistance are undesirable to electric signals, especially to alternating current signals. This high inductance and resistance problem, that is, high impedance problem is very serious in transmitting high frequency signals, such as RF signals. Additionally, the inductance inherent in the coil varies depending on the coil length which is determined by the displacement of the plunger. This inductance change is a nuisance and badly affects the signal transmission through the connector.

SUMMARY OF THE INVENTION

It is accordingly an object of the present invention to provide a spring loaded electric connector having low impedance.

Another object of the present invention is to provide aspring loaded electric connector whose inductance is constant.

The foregoing and other objects are achieved by a connector according to the present invention, which comprises:

a cylindrical body adapted to receive an electrically conductive wire attached thereto for electrical connection to an electrical circuit;

a plunger guided by said body and slidingly movable between an extended position and a retracted position relative to said body, said plunger having a tip for making electrical contact with a conductive surface external to said body;

spring means interposed between said body and said plunger for biasing said plunger toward the extended position; and cantilever means adapted to make electrical sliding contact between said plunger and said body so as to establish an electrical path short-circuiting spring means.

In accordance with the aspect of the present invention, the electrical path established by the sliding contact of the cantilever bypasses the spring, and therefore, can significantly reduce the impedance (resistance and inductance) of the connector.

Other objects, aspects and advantages of the present invention will become apparent to one skilled in the art from the following description and the appended claims.

BRIEF DESCRIPTION OF THE DRAWINGS

Embodiments of the present invention will now be described by way of example and with reference to the accompanying drawings.

FIG. 1 is a perspective view of a miniature pin type electric connector into which the present invention may be incorporated.

FIG. 2 is a partially cross-sectional side view of the connector shown in FIG. 1, illustrating how the connector is used to complete a circuit.

FIG. 3 is an enlarged axial cross-sectional view of an electric connector according to one embodiment of the present invention, illustrating a cantilever formed as a portion of a plunger.

FIG. 5 is a similar cross-sectional view of still another embodiment of the present invention, illustrating a separate sleeve type cantilever attached to an inner wall of a cylindrical body.

FIG. 6 is a similar cross-sectional view of a further embodiment of the present invention, illustrating a separate sleeve type cantilever attached to a body and elongated up to a stopper.

DESCRIPTION OF THE PREFERRED EMBODIMENT

Figure 3A:
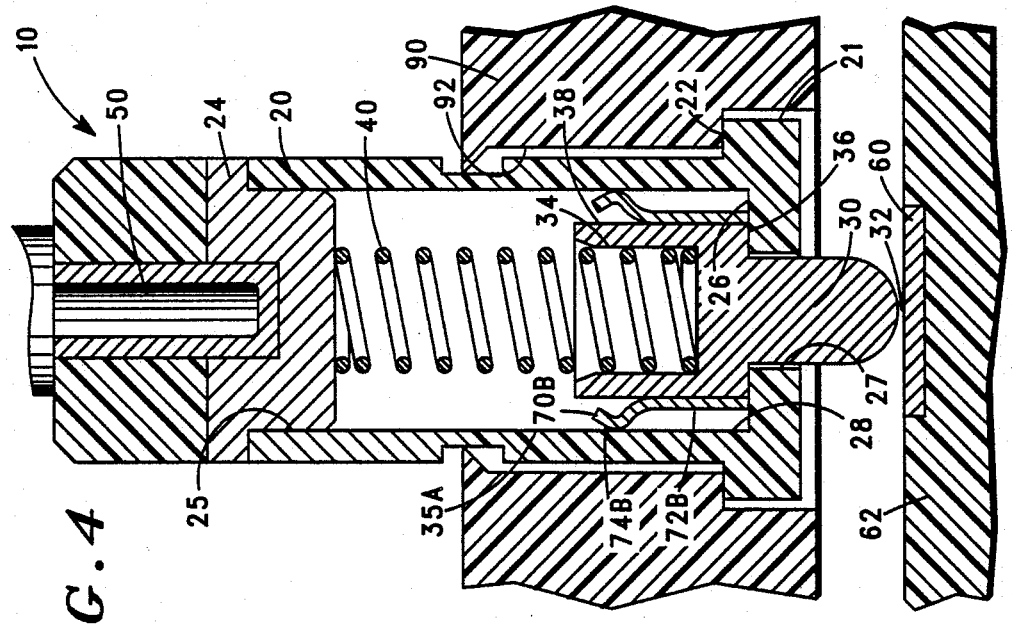
FIG. 3A is a schematic cross-sectional view similar to FIG. 3, illustrating another embodiment of a cantilever.

Referring now to the drawings, the same reference numerals designate the same or corresponding parts throughout the several views. FIG. 1 shows a perspective view of a miniature pin type electric connector 10, into which the present invention may be incorporated.

FIG. 3 illustrates an enlarged cross-sectional view of an electric connector 10 according to one embodiment of the present invention. Connector 10 basically consists of a hollow cylindrical body 20, and a plunger 30A and a coil spring 40 contained within body 20.

The upper end 25 of tubular body 20 is open. At the periphery of the lower end of body 20, a larger diameter portion 21 is provided to form a shoulder 22. A mounting panel 90 presses shoulder 22 downward when connector 10 should be set on a desired place as described hereinbelow. The lowest end of body 20 has a circular opening 27. The diameter of opening 27 is smaller than that of the inner wall 28 of hollow cylindrical body 20. And a shoulder portion 26 is formed inside of body 20. Body 20 is, preferably, made of metallic material. Alternatively, body 20 may be formed of synthetic resin such as plastic, covered with metallic layers, at least on its inner wall. Body 20 is inserted and fixed in a hole 92 of mounting panel 90. Mounting panel 90 has a plurality of such holes (not shown), each of which receives one pin type connector.

A solid stopper 24 having a circular cross-section is capped to the upper open end 25 of body 20. Stopper 24 receives an electrically conductive wire 50, for electrical connection between the connector and another remote device or circuit. Preferably, stopper 24 is made of metallic material. Alternatively, stopper 24 may be formed of synthetic resin covered with metallic layers.

Plunger 30A is generally cylindrical and consists of a tubular upper half and a solid lower half. The upper half of plunger 30A has a larger outer diameter and has a recessed portion 34 inside thereof. The lower half of plunger 30A has a diameter smaller than the outer diameter of the upper half. This difference in diameter between both halves forms a shoulder portion 36. The diameter of the lower half of plunger 30A is slightly smaller than the inner diameter of opening 27 of body 20. The lowest end of the lower half of plunger 30A is a semi-spherical tip 32 for connecting with an external electrode. Plunger 30A can slide upward and downward relative to body 20. When plunger 30A moves downward, the lower half of plunger 30A passes through opening 27 of body 20 and tip 32 of plunger 30A protrudes out of the lowest end of body 20 (extended position). In this extended position, tip 32 of plunger 30A can electrically contact with an electrode 60 which is an electrically conductive surface formed on top of a plate 62 external to body 20. Shoulder portion 36 of plunger 30A and shoulder portion 26 of body 20 cooperate to limit the downward movement of plunger 30A, even when surface 60 does not exist below tip 32. On the other hand, tip 32 withdraws (retracted position), when plunger 30A goes upward. Plunger 30A is, preferably, made of resilient metallic material. Alternatively, plunger 30A may be formed of elastic resin covered with electrically conductive material.

Coil spring 40 is, generally, interposed between body 20 or stopper 24 and plunger 30A. More specifically, the upper end of compression spring 40 contacts the bottom face of stopper 24, and the lower end of spring 40 is received in recess portion 34 of plunger 30A. Coil spring 40 does not need to be electrically conductive. Plunger 30A is always biased downward (in the direction of the extended position) by the force of coil spring 40 compressed between stopper 24 and plunger 30A. Therefore, the restoring force of coil spring 40 assures that tip 32 is always contacting with surface 60 of plate 62 with great reliability, and reduces an ohmic resistance through the contact between tip 32 and surface 60.

The upper edge or rim 35A of the upper half of plunger 30A is bent or curved radially outward to form a cantilever 70A. Cantilever 70A is contacting the inner wall 28 of tubular body 20. Because plunger 30A has resiliency, cantilever 70A is always pressing against and never detached from the inner wall of body 20 throughout the sliding movement of plunger 30A. Therefore, cantilever 70A makes reliable electrical contact between plunger 30A and body 20. Alternatively, a spring cantilever 70A' may riveted or spot welded to an upper surface of plunger 30A' as shown in FIG. 3A. In this case, reliable electrical contact between plunger 30A' and body 20 is also obtained.

In operation, when mounting panel 90 is placed over and aligned with plate 62, tip 32 is positioned right on conductive surface 60, and pressed against it to make electrical contact. Thus connector 10 according to this embodiment of the present invention establishes an electrical path which is from conductive surface 60, through tip 32, cantilever 70A, body 20 and stopper 24 to wire 50, bypassing or short-circuiting coil spring 40. This electrical path passing through cantilever 70A has low resistance less than that of the prior electrical path passing through the coil, because the distance of the path through the cantilever is shorter than that of the conventional coil path. Besides, whereas a coil has very high inductance, the electrical path through the cantilever has little inductance. Thus the connector according to the present invention has significantly reduced its impedance. Additionally, the inductance of the electrical path through the cantilever does not vary even while the plunger moves up and down. Therefore, the connector according to the present invention provides low and constant impedance property which is very advantageous to alternating current signals, especially to RF signals.

Figure 4:
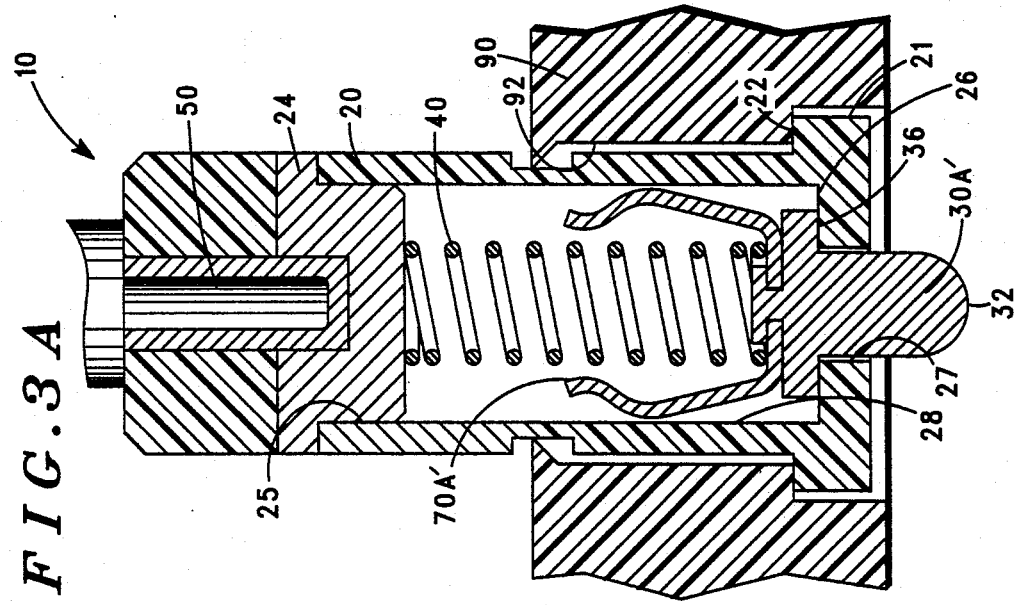
FIG. 4 is an enlarged cross-sectional view of another embodiment of the present invention, illustrating a separate sleeve type cantilever attached to an outer wall of a plunger.

FIG. 4 shows another preferred embodiment of the present invention in which a separate sleeve type cantilever 70B is attached to the outer wall 38 of plunger 30. Cantilever 70B is, preferably, made of resilient and electrically conductive material. Alternatively, cantilever 70B may be formed of elastic resin covered with a conductive layer. Cantilever 70B consists of a lower proximal portion 72B and an upper distal portion 74B. Straight proximal portion 72B is actually fixed to outer wall 38 of plunger 30 by some means such as press fitting and electrically connected to it. Distal portion 74B is curved or bent from proximal portion 72B radially outward, and is slidingly contacting with the inner wall 28 of tubular body 20 to make electrical contact with it. The electrically conductive and resilient properties of cantilever 70B assure reliable electrical connection between plunger 30 and body 20. Thus connector 10 of this embodiment establishes an electrical path similar to that shown in FIG. 3. The electrical path of this embodiment has low resistance and low and constant inductance, and therefore low and constant impedance.

FIG. 5 shows still another embodiment of the present invention in which a separate sleeve type cantilever 70C is attached to the inner wall 28 of body 20. Cantilever 70C is, preferably, made of resilient and electrically conductive material. Alternatively, cantilever 70C may be formed of elastic resin covered with a conductive layer. Cantilever 70C consists of an upper straight proximal portion 72C and a lower curved distal portion 74C. Proximal portion 72C is actually fixed by some means such as press fitting to inner wall 28 of body 20 and electrically connected to it. Distal portion 74C is curved or bent from proximal portion 72C radially inward, and is contacting with the outer wall 38 of plunger 30 to make electrical contact with it. The electrically conductive and resilient properties of cantilever 70C assure reliable electrical connection between plunger 30 and body 20. Thus connector 10 of this embodiment also establishes an electrical path similar to that shown in FIG. 3. The electrical path of this embodiment has low and constant impedance.

FIG. 6 shows a further embodiment of the present invention which is similar to the previous embodiment shown in FIG. 5, but has one significant difference from the FIG. 5 embodiment. The difference in the embodiment of FIG. 6 is that an upper proximal portion 72D of a cantilever 70D is elongated enough to reach a stopper 24. The elongated portion 76D of cantilever 70D contacts with and electrically connects to stopper 24 which is also electrically conductive. Connector 10 according to this embodiment shown in FIG. 6 establishes a simplified electrical path which is from conductive surface 60, through tip 32 and cantilever 70D, and directly to stopper 24 and wire 50 (bypassing body 20). Therefore, body 20 of this embodiment is not required to be electrically conductive. Thus, the connector of the FIG. 6 embodiment provides especially low resistance, and therefore low and constant impedance. Alternatively, stopper 24 and cantilever 70D may be formed as one solid integral conductive material, instead of two parts. In this case, further low resistance can be achieved because of no contact resistance between the two parts.

Figure 7:
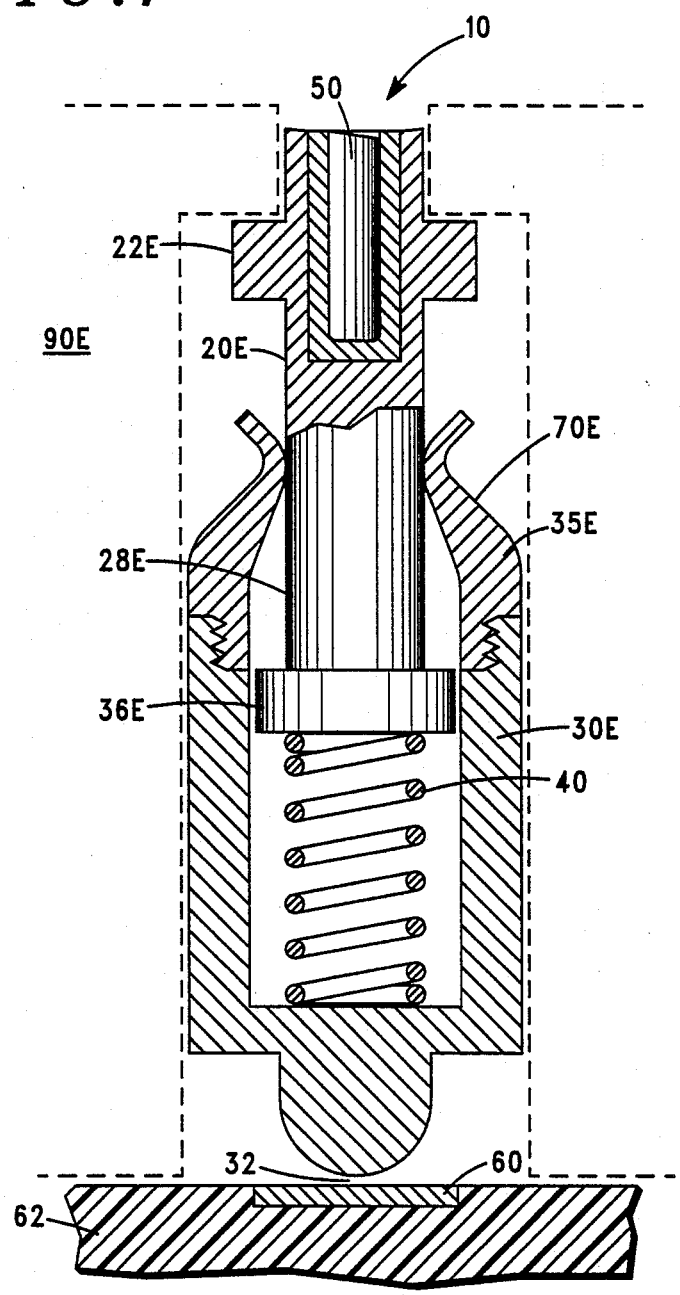
FIG. 7 is a simplified cross-sectional side view of a connector according to a still further embodiment of the present invention, illustrating a tubular plunger encircling a body.

FIG. 7 illustrates an enlarged cross-sectional view of an electric connector 10 according to a still further embodiment of the present invention, in which a solid cylindrical body 20E is inserted into a tubular plunger 30E. Connector 10 basically consists of a hollow cylindrical plunger 30E, and a solid cylindrical body 20E and a coil spring 40 contained within plunger 30E.

The upper end of body 20E receives an electrically conductive wire 50, for electrical connection between the connector and an other remote device or circuit. At the middle of body 20E, formed is a flange 22E to be forced downward by a mounting panel 90E. The lower portion of body 20E is inserted into cylindrical plunger 30E. The lowest end of body 20E has a flange 36E which prevents plunger 30E from falling off. Body 20E is, preferrably, made of metallic material. Alternatively, body 20E may be formed of synthetic resin such as plastic, covered with metallic layers. Body 20E is inserted and fixed in a mounting panel 90E.

In this embodiment, stopper 24 as shown in FIG. 3 is not required.

Plunger 30E is hollow cylindrical and consists of a tubular upper half having a large diameter, and a solid lower half having a smaller diameter. The lowest end of plunger 30E is a semi-spherical tip 32 for connecting with an electrically conductive surface 60 external to body 20E. Plunger 30E can slide and move upward (toward a retracted position) and downward (toward an extended position) along body 20E. In the extended position, tip 32 of plunger 30E can electrically contact with surface 60. Plunger 30E is, preferrably, made of resilient metallic material. Alternatively, plunger 30E may be formed of elastic resin covered with electrically conductive material.

Coil spring 40 is, generally, interposed between body 20E and plunger 30E. More specifically, the upper end of compression spring 40 contacts the bottom face of body 20E, and the lower end of spring 40 sits on an inner bottom surface of plunger 30E. Coil spring 40 does not need to be electrically conducting. Plunger 30E is always biased downward (in the direction of the extended position) by the force of coil spring 40 compressed between body 20E and plunger 30E. Therefore, the restoring force of coil spring 40 assures that tip 32 is always contacting with conductive surface 60 with great reliability, and reduces an ohmic resistance through the contact.

The upper edge or rim 35E of the upper half of plunger 30E is bent or curved radially inward to form a cantilever 70E. Cantilever 70E is contacting an outer wall 28E of body 20E. Because plunger 30E has resiliency, cantilever 70E is always pressing against and never detached from outer wall 28 of body 20E throughout the sliding movement of plunger 30E. Therefore, cantilever 70E makes reliable electrical contact between plunger 30E and body 20E. Thus connector 10 according to this embodiment of the present invention establishes an electrical path which is from the conductive surface, through tip 32, cantilever 70E and body 20E to wire 50 short-circuiting coil spring 40. This electrical path through cantilever 70E has low resistance less than that of the electrical path through the coil, because the distance of the path through the cantilever is shorter than the coil path distance. Besides, whereas a coil has very high inductance, the electrical path through the cantilever has low inductance. Additionally, the inductance of the electrical path through the cantilever does not change even while the plunger moves up and down. Thus the connector of this embodiment can provide low and constant impedance.

While the present invention has been particularly set forth in terms of specific embodiments thereof, it will be understood in view of the instant disclosure, that numerous variations upon the invention are now enabled to those skilled in the art, which variations yet reside within the scope of the present teaching. Accordingly, the invention is to be broadly construed, and limited only by the scope and spirit of the claims now appended hereto.

We claim:

1. A low impedance, spring loaded connector for connecting electrical signals, comprising:
   a cylindrical body adapted to receive an electrically conductive wire attached thereto for electrical connection to an electrical circuit;
   a plunger guided by said body and slidingly movable between an extended position and a retracted position relative to said body, said plunger having a tip for making electrical contact with a conductive surface external to said body;
   spring means interposed between said body and said plunger for biasing said plunger toward the extended position; and
   cantilever means adapted to make electrical sliding contact between said plunger and said body so as to establish an electrical path short-circuiting said spring means and the electrical path so established providing a constant low resistance and inductance path independent of the state of the spring means.

2. A low impedance, spring loaded connector as claimed in claim 1, wherein said cantilever means is formed as a portion of said plunger by bending a portion of said plunger to slidingly contact a surface of said body.

3. A low impedance, spring loaded connector as claimed in claim 1, wherein said plunger is received within said cylindrical body and generally axially movable relative to said cylindrical body.

4. A low impedance, spring loaded connector as claimed in claim 1, wherein said plunger receives said cylindrical body therewithin and generally axially movable relative to said cylindrical body.

5. A low impedance, spring loaded connector as claimed in claim 3, wherein said cantilever means comprises a separate cylindrical sleeve positioned between said cylindrical body and said plunger.

6. A low impedance, spring loaded connector as claimed in claim 5, wherein said cylindrical sleeve is fixed onto an outer surface of said plunger, and a portion of said sleeve is bent to slidingly contact an inner surface of said cylindrical body.

7. A low impedance, spring loaded connector as claimed in claim 5, wherein said cylindrical sleeve is fixed onto an inner surface of said cylindrical body, and a portion of said sleeve is bent to slidingly contact an outer surface of said plunger.

8. A low impedance, spring loaded connector as claimed in claim 7, wherein said cylindrical body is provided with a stopper fixed to one end thereof, said stopper being formed to receive an end of the electrically conductive wire therein.

9. A low impedance, spring loaded connector as claimed in claim 8, wherein said stopper has an electrically conductive surface making electrical contact with the wire and another electrically conductive surface making contact with said cylindrical sleeve, and said cylindrical sleeve is formed of electrically conductive material and establishes an electrical path from said plunger through the electrically conductive surfaces of said stopper to the wire.

10. A low impedance, spring loaded connector as claimed in claim 5, wherein said cylindrical sleeve is formed of resilient metallic material.

* * * * *